United States Patent
Hwang et al.

(10) Patent No.: US 7,351,991 B2
(45) Date of Patent: Apr. 1, 2008

(54) METHODS FOR FORMING PHASE-CHANGE MEMORY DEVICES

(75) Inventors: Young-Nam Hwang, Gyeonggi-do (KR); Young-Tae Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 11/413,318

(22) Filed: Apr. 28, 2006

(65) Prior Publication Data

US 2006/0211165 A1  Sep. 21, 2006

Related U.S. Application Data

(62) Division of application No. 10/814,670, filed on Mar. 31, 2004, now Pat. No. 7,067,837.

(30) Foreign Application Priority Data

Apr. 2, 2003  (KR) ............... 2003-20755

(51) Int. Cl.
    *H01L 47/00* (2006.01)

(52) U.S. Cl. ............ 257/3; 257/E45.002; 257/4; 257/42

(58) Field of Classification Search ............ 257/3
     See application file for complete search history.

(56) References Cited

U.S. PATENT DOCUMENTS

| | | | |
|---|---|---|---|
| 6,329,666 B1 | 12/2001 | Doan et al. | |
| 6,566,700 B2 * | 5/2003 | Xu | ............... 257/296 |
| 6,791,107 B2 | 9/2004 | Gill et al. | |
| 6,944,945 B1 | 9/2005 | Shipley et al. | |
| 2003/0116794 A1 | 6/2003 | Lowery | |
| 2004/0113181 A1 | 6/2004 | Wicker | |
| 2004/0113232 A1 | 6/2004 | Johnson et al. | |

* cited by examiner

*Primary Examiner*—Tu-Tu Ho
(74) *Attorney, Agent, or Firm*—Myers Bigel Sibley & Sajovec

(57) ABSTRACT

Phase-change memory devices include a phase-change material layer and a first electrode having a contact area therebetween. The contact area extends into a recess of the first electrode to provide current density concentration.

13 Claims, 11 Drawing Sheets

METHODS FOR FORMING PHASE-CHANGE MEMORY DEVICES

CLAIM OF PRIORITY

This application claims priority to and is a divisional of parent application Ser. No. 10/814,670, filed Mar. 31, 2004, now issued as U.S. Pat. No. 7,067,837, which claims the benefit from Korean Patent Application No. 2003-20755, filed on Apr. 2, 2003, in the Korean Intellectual Property Office, the disclosures of which are hereby incorporated herein by reference.

BACKGROUND OF THE INVENTION

The present invention relates to integrated circuit (semiconductor) memory devices and more specifically, to phase-change memory devices and methods for forming the same.

Semiconductor memory devices are generally classified as volatile memory devices or as non-volatile memory devices, based on whether data can be maintained when power to the device is turned off. Examples of a volatile memory device include a dynamic random access memory (DRAM) or a static random access memory (SRAM). An example of a non-volatile memory device is a FLASH memory. In such memory devices, stored binary information, having a "0" or a "1" state, may be determined by sensing a stored charge in a memory cell.

Investigations continue to develop new types of memory devices having, for example, a non-volatile property, temporary accessing, a low power operation property and/or high integration. An example of one such memory type being investigated is a phase-change memory device. A phase-change memory device generally operates using a phase-change material. A crystal state of the phase-change material may be changed using resistive heating, which may be provided using a current pulse. A chalcogenide compound of germanium Ge, antimony Sb and tellurium Te may be used as the phase-change material.

Thus, chalcogenides are a class of material that may be used to store information in an integrated circuit memory device. Chacogenide material may be electrically stimulated to change states, from an amorphous state to an increasingly crystalline state. In the amorphous state, chacogenide material generally exhibits a high electrical resistivity. As a chalcogenide material progresses into an increasingly crystalline state, its electrical resistivity generally decreases.

In chacogenide-based memories, the memory cells are typically formed by disposing chalcogenide material between two electrodes. A size of a contact area between the electrode and the chalcogenide material appears to be related to the operating speed of device, the power requirement of the device and/or performance of the device. When heat is applied to the chalcogenide material through the contact area to the electrodes, a portion of the chalcogenide material (referred to as a program volume) generally changes state. For a smaller program volume, a smaller program current may generally be used for changing state. The size of program volume is typically related to the size of the contact area. To reduce the program current and/or time, studies have been directed to reducing the size of the contact area.

FIG. 1 is a schematic cross-sectional view of a conventional phase-change memory device. As shown in FIG. 1, the device include insulation layers 11, 19, a bottom electrode 13, a phase-change material layer 15, an upper electrode 17, an upper electrode contact 21 and a bit line 23. The bottom electrode 13 is shown as a plug-type electrode that provides a current pulse to change a crystalline state of the phase-change material layer 15. For the conventional phase-change memory device illustrated in FIG. 1, the bottom electrode 13 and the phase-change material layer 15 are in contact at a flat contact area 25. The size of the contact area 25 depends on the configuration and/or diameter of the plug-type bottom electrode 13. When current flows through the bottom electrode 13, the current generally passes through the phase-change material layer 15 and the upper electrode 17. For the configuration illustrated in FIG. 1, the current is concentrated on the contact area 25 as schematically illustrated by the arrows. The arrows further indicate that the current may spread from the contact area 25 through the whole phase-change material layer 15. As such, the current density generally gradually decreases. Therefore, as illustrated in FIG. 1 by the shaded region, a program volume having a hemisphere configuration may be formed on the contact area 25.

In the conventional phase-change memory device of FIG. 1, it is generally required to reduce the size of the contact area 25 to reduce program current. The reduction in contact area 25 may be provided by reducing the diameter of the bottom electrode 13. However, the diameter of the bottom electrode 13 may be limited by a resolution of a photolithography process used in forming the bottom electrode 13. As a result, there is generally a limit to how much the program current may be reduced by this approach.

In an alternative approach, U.S. Pat. No. 6,329,666 describes a bottom electrode having a tip shape to reduce the program current. FIG. 2 illustrates a phase-change memory device as described in U.S. Pat. No. 6,329,666. As shown in FIG. 2, the device includes a semiconductor substrate 100, a bottom electrode 102 and a tip 114 of the bottom electrode 102. The device of FIG. 2 also includes insulation layers 116, 124, a phase-change material layer 120, an upper electrode 122, 128, an interconnection 126 and a program volume 130. The tip 114 includes a top surface 118. In the device of FIG. 2, a dimension of the top surface 118 of the contact area is formed smaller than in the device of FIG. 1 by using a tip 114 on the bottom electrode 102. As a result, the program current may be decreased. However, the contact area between the bottom electrode 102 and the phase-change material layer 120, that is, the contact area defined by the top surface 118, is flat. Accordingly, as with the device shown in FIG. 1, the configuration of the program area 130 is hemispherical. In other words, when current flows through the bottom electrode 102, the current passes through the phase-change material layer 120 and flows to the upper electrode 128, 122. As such, the current may be concentrated on the contact area 118 and then spread through the whole phase-change material layer 120. As a result current density typically gradually decreases.

For both the known phase-change memory devices described above, current flows from the contact area to the phase-change material layer in a variety of directions as shown by the arrows in FIG. 1 and FIG. 2. This generally arises from the flat (planar)) contact area. As a result, current density generally decreases as the current passes through the phase-change material layer, which may increase the difficulty of reducing the program current in such devices.

SUMMARY OF THE INVENTION

Embodiments of the present invention provide phase-change memory devices that include a phase-change material layer and a first electrode having a contact area therebetween. The contact area extends into a recess of the first electrode to provide current density concentration adjacent thereto (i.e., an increase as compared to a flat contact area). The portion of the phase-change material layer extending into the recess of the first electrode may be a tapering tip of a vertical part of the phase-change material layer that contacts the first electrode at the contact area. The tapering tip of the vertical part may be "V" shaped.

In other embodiments of the present invention the phase-change material layer also includes a horizontal part extending above the vertical part and the phase-change memory device further includes a second electrode on the horizontal part. The first electrode may include a recessed slope part contacting the tip of the vertical part and a horizontal part extending from the recessed slope part and separated from the horizontal part of the phase-change material layer by an insulation layer.

In further embodiments of the present invention, the phase-change memory device further includes an integrated circuit substrate and an interlayer dielectric layer on the integrated circuit substrate. An insulation layer may be provided on the interlayer dielectric layer that has a sloped opening therein. The first electrode may have a vertical part formed in the sloped opening to provide the recess in the first electrode. The phase-change memory device may further include a transistor formed in the integrated circuit substrate below the interlayer dielectric layer and having a source region and a drain region and a contact plug extending through the interlayer dielectric layer and electrically connecting the first electrode to the source region or the drain region. An upper dielectric layer may be provided on the interlayer dielectric layer and the second electrode and a second electrode contact may extend through the upper dielectric layer from the second electrode to contact an upper interconnection.

In other embodiments of the present invention, a sidewall spacer is provided in the sloped opening that separates the vertical part of the first electrode from the insulation layer. The insulation layer may include a first layer on the interlayer dielectric layer and a second layer on the first layer. The sloped opening may have a sloped upper portion defined by the second layer and a substantially vertical lower portion defined by the first layer. The first layer may be a silicon oxynitride layer and the second layer may be a silicon oxide layer.

In further embodiments of the present invention, phase-change memory devices further include an integrated circuit substrate and an interlayer dielectric layer on the integrated circuit substrate. A first insulation layer is on the interlayer dielectric layer and has a sloped opening having a first minimum diameter therein. The first electrode has a vertical part formed in the sloped opening and a horizontal part formed on the first insulation layer. A second insulation layer is on the first electrode and has a second opening having a maximum diameter greater than the minimum diameter of the sloped opening therein and extending to the vertical part of the first electrode. The vertical part of the phase-change material layer is formed in the second opening and a horizontal part of the phase-change material layer is formed on the second insulation layer. A second electrode is on the phase-change material layer.

In other embodiments of the present invention, phase-change memory devices include a semiconductor substrate and a first insulation layer on the semiconductor substrate. The first insulation layer has a first opening defined by an upper sloped sidewall part and a bottom vertical sidewall part extending from the upper sloped sidewall part. A first electrode is disposed in the first opening and on the first insulation layer. The first electrode has a recessed slope part in the first opening and a horizontal part on the first insulation layer outside of the first opening. A second insulation layer is on the first electrode. The second insulation layer has a second opening that exposes the recessed slope part of the first electrode. A phase-change material layer is disposed in the second opening and on the second insulation layer and a second electrode is on the phase-change material layer. The recessed slope part of the first electrode may be substantially "V" shaped.

In further embodiments of the present invention, the first insulation layer includes a stacked silicon oxynitride layer and silicon oxide layer. The bottom vertical sidewall part of the first opening is defined by the silicon oxynitride layer and the upper slope sidewall part of the first opening is defined by the silicon oxide layer. The phase-change material layer may include a combination of at least one material selected from the group consisting of Te and Se and another material selected from the group consisting of Pb, Sn, Ag, As, S, Si, P, O and N.

In other embodiments of the present invention, a diameter of the second opening is smaller than a diameter of a bottom opening defined by the bottom vertical sidewall part of the first opening. The first insulation layer is a double-layer structure and includes an insulation spacer. The double-layer structure is formed of a stacked silicon oxynitride layer and silicon oxide layer having an opening therein and the insulation spacer is arranged on both sidewalls of the opening in the double layer structure. An upper part of the insulation spacer is sloped and a lower part of the insulation spacer is vertical. The upper slope sidewall of the first opening is defined by the upper sloped part of the insulation spacer and the bottom vertical sidewall of the first opening is defined by the bottom vertical part of the insulation spacer. A diameter of the second opening may be smaller than a diameter of the bottom opening defined by the bottom vertical sidewall of the first opening.

In further embodiments of the present invention, fabricating a phase-change memory device includes forming a first insulation layer having a first opening therein on an integrated circuit substrate. A first electrode is formed on the first insulation layer. The first electrode has a vertical part including a recess in an upper portion thereof in the first opening. A phase-change material layer is formed on the first electrode and extending into the recess.

In other embodiments of the present invention, forming a first insulation layer includes patterning the first insulation layer to form the first opening, the first opening including a top opening defined by a sloped upper sidewall part and a bottom opening defined by a substantially vertical bottom sidewall part. Forming a first electrode includes forming a conformal first electrode layer along the first insulation layer and the first opening to have a recessed slope part in the first opening. Forming a phase-change material layer includes forming a second insulation layer on the first electrode layer, patterning the second insulation layer to have a second opening exposing the recessed slope part of the first electrode layer and forming a phase-change material layer on the second insulation layer to fill the second opening. A second electrode layer may be formed on the phase-change material layer and the second electrode layer, the phase-change material layer, the second insulation layer and the first electrode layer may be sequentially patterned.

In further embodiments of the present invention, patterning the first insulation layer includes forming an etching mask on the first insulation layer, isotropic etching a partial thickness of the first insulation layer exposed by the etching mask to form the top opening and then anisotropic etching a remainder of the first insulation layer exposed by the etching mask to form a bottom opening. In alternative embodiments, patterning the first insulation layer includes forming an etching mask on the first insulating layer, anisotropic etching the first insulation layer exposed by the etching mask to form a temporary bottom opening having diameter of the bottom opening on the first insulation layer and then isotropic etching a partial thickness of the first insulation layer defining the top of the temporary bottom opening to form the top opening. A residual temporary bottom opening corresponds to the bottom opening.

In other embodiments of the present invention, the first insulation layer is formed by sequentially stacking a silicon oxynitride layer and a silicon oxide layer. The top opening is formed in the oxide silicon layer and the bottom opening is formed in the silicon oxynitride layer. The second opening may be formed to have a diameter smaller than a diameter of the bottom opening of the first opening.

In further embodiments of the present invention, a silicon oxynitride layer and a silicon oxide layer are formed on the second electrode layer, after forming the second electrode layer. The silicon oxide layer and the silicon oxynitride layer are patterned while patterning the second electrode layer, the phase-change material layer, the second insulation layer and the first electrode layer.

In other embodiments of the present invention, before forming the first insulation layer, a transistor is formed on the semiconductor substrate and a first interlayer dielectric layer is formed to cover the transistor on the semiconductor substrate. A contact pad is formed electrically connected to a source region of the transistor and a first interconnection is formed connected to a drain region of the transistor. After patterning the oxide layer, the nitride oxide layer, the second electrode layer, the phase-change material layer, the second insulation layer and the first electrode layer, a protection insulation layer is formed. A second interlayer dielectric layer is formed on the protection insulation layer. The second interlayer dielectric layer, the protection insulation layer, the patterned silicon oxide layer and the patterned silicon oxynitride layer are patterned to form a via hole exposing the patterned second electrode layer. The via hole is filled with a conductive material and a second interconnection is formed on the second interlayer dielectric layer and the conductive material.

In further embodiments of the present invention, fabricating phase-change memory devices includes forming a first insulation layer on a semiconductor substrate and patterning the first insulation layer to form a temporary opening. An insulation layer spacer is formed on a sidewall of the temporary opening, the insulation layer spacer defining a first opening including a top opening defined by a sloped-top lateral part and a bottom opening defined by a vertical-bottom-lateral part. A first electrode layer is formed along the first opening and the first insulation layer to have a recessed slope part in the first opening. A second insulation layer is formed on the first electrode layer. The second insulation layer is patterned to have a second opening exposing the recessed slope part of the first electrode layer. A phase-change material layer is formed in the second opening and on the second insulation layer. A second electrode layer is formed on the phase-change material layer and the second electrode layer, the phase-change material layer, the second insulation layer and the first electrode layer are sequentially patterned.

In other embodiments of the present invention, a silicon oxynitride layer and an silicon oxide layer are formed on the second electrode layer after forming the second electrode layer. The silicon oxide layer and silicon oxynitride layer are patterned while sequentially patterning the second electrode layer, the phase-change material layer, the second insulation layer and the first electrode layer.

In further embodiments of the present invention, before forming the first insulation layer, a transistor is formed on the semiconductor substrate, a first interlayer dielectric layer is formed to cover the transistor on the semiconductor substrate and a contact pad is formed electrically connected to a source region of the transistor and a first interconnection is formed connected to a drain region of the transistor. After sequentially patterning the silicon oxide layer, the silicon oxynitride layer, the second electrode layer, the phase-change material layer, the second insulation layer and the first electrode layer, a protection insulation layer is formed. A second interlayer dielectric layer is formed on the protection insulation layer. The second interlayer dielectric layer, the protection insulation layer, the patterned oxide silicon layer and the silicon oxynitride layer are patterned to form a via hole exposing the patterned second electrode layer. The via hole is filled with a conductive material and a second interconnection is formed on the second interlayer dielectric layer and the conductive material.

BRIEF DESCRIPTION OF THE DRAWINGS

The accompanying drawings, which are included to provide a further understanding of the invention and incorporated in and constitute a part of this application, illustrate embodiments of the invention and, together with the description, serve to explain the invention.

DETAILED DESCRIPTION OF THE INVENTION

Figure 1:
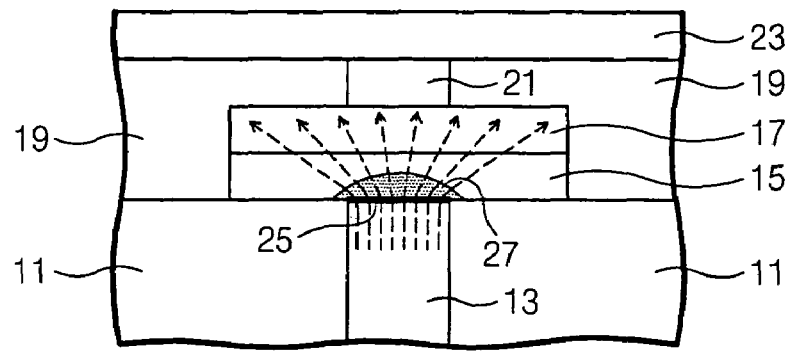
FIG. 1 is a schematic cross-sectional view of a phase-change memory device according to the prior art.
Figure 2:
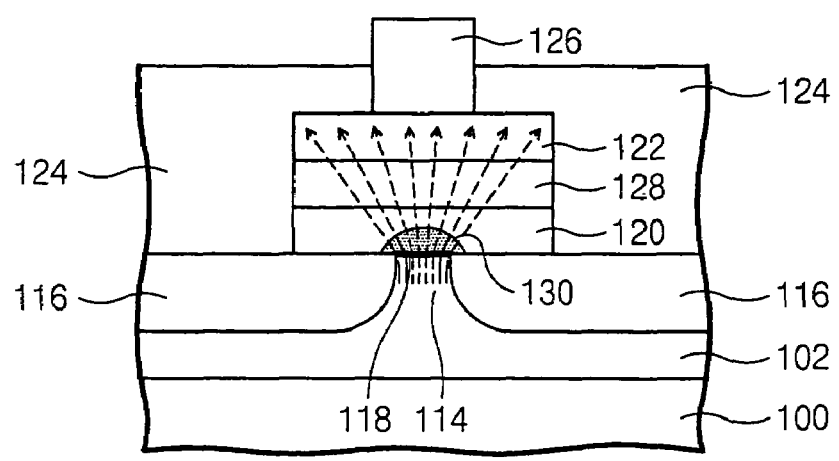
FIG. 2 is a schematic cross-sectional view of a phase-change memory device according to the prior art.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element is referred to as being "attached", "connected," "on" or "coupled" to another element, it can be directly connected or coupled to or on the other element or intervening elements may be present. In contrast, when an element is referred to as being "directly attached," "directly connected," "directly on" or "directly coupled" to another element, there are no intervening elements present. Like numbers refer to like elements throughout the specification. As used herein the term "and/or" includes any and all combinations of one or more of the associated listed items.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure.

Figure 3A:
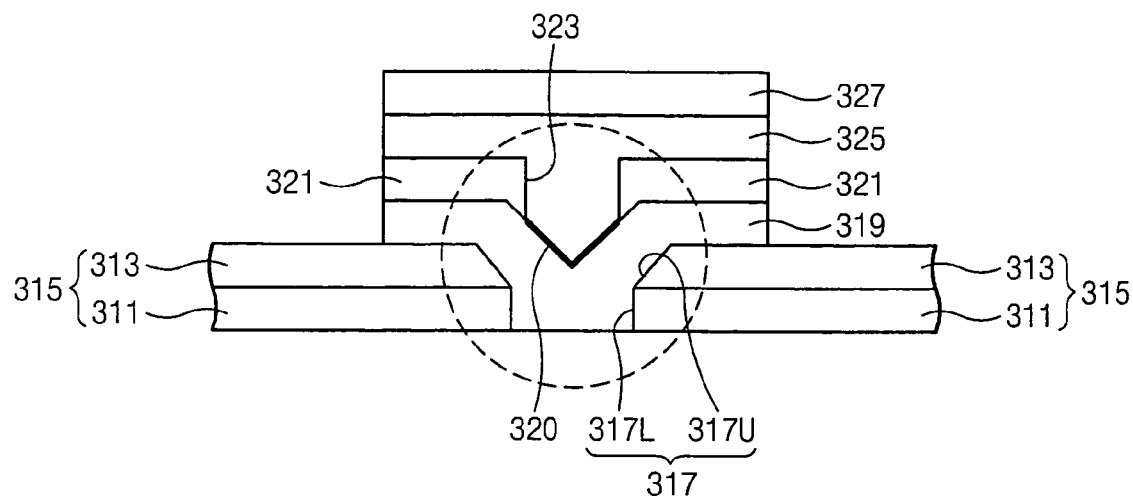
FIG. 3A is a schematic cross-sectional view of a phase-change memory device according to some embodiments of the present invention.
Figure 3B:
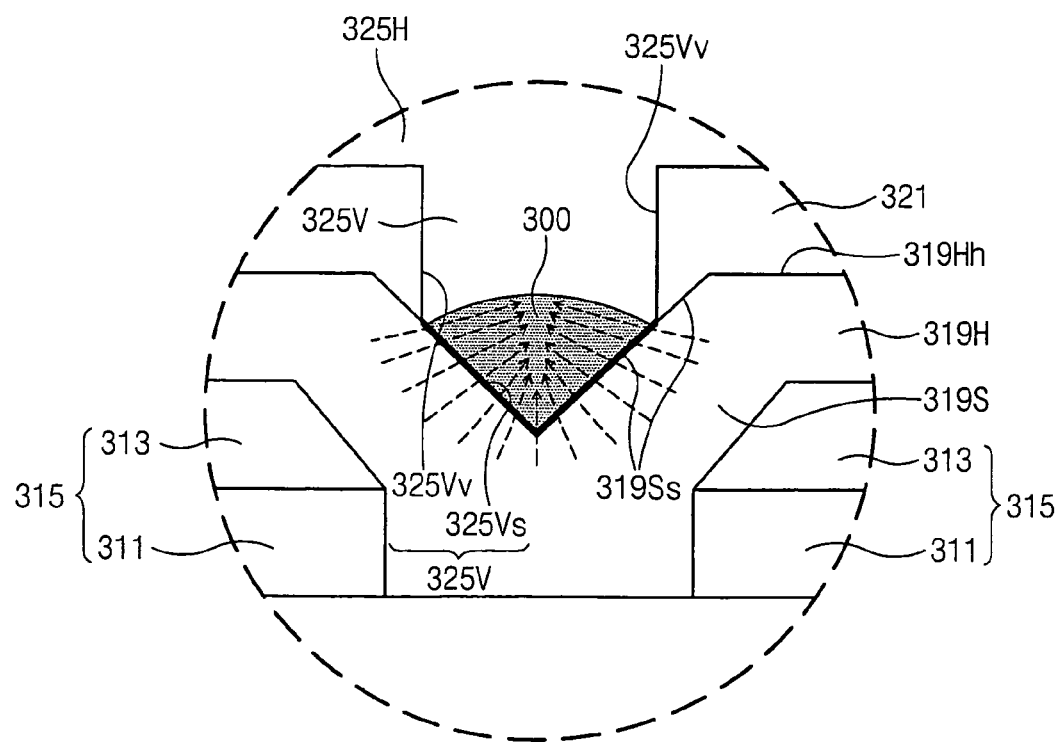
FIG. 3B is a schematic cross-sectional view of the portion of the device of FIG. 3A enclosed within the dashed line on FIG. 3A.

Embodiments of the present invention will now be further described with reference to FIGS. 3A and 3B. FIG. 3A is a schematic cross-sectional view of a phase-change memory device according to some embodiments of the present invention. FIG. 3B illustrates an expanded view of a portion of the device of FIG. 3A, in particular, of the portion within the dashed line in FIG. 3A. As shown in FIG. 3A, the phase-change memory device includes first insulation layer 315 and second insulation layer 321. A first opening 317 is formed on the first insulation layer 315 and a second opening 323 is formed on the second insulation layer 321. The device further includes a first electrode 319, a phase-change material layer 325 and a second electrode 327. A contact area is located between the first electrode 319 and the phase-change material layer 325.

As seen in FIG. 3B, the phase-change material layer 325 includes horizontal part 325H and a vertical part 325V. The first electrode 319 includes a horizontal part 319H and a recessed slope part 319S. The vertical part 325V of the phase-change material layer 325 includes a vertical sidewall 325Vv and a slope sidewall 325Vs. The horizontal part 319H has a top surface 319Hh and the slope part 319S includes a top surface 319Ss. A program volume 300 may be defined in the phase-change material layer 325 adjacent the top surface 319Ss.

Referring again to FIG. 3A, the phase-change memory device in the illustrated embodiments may include the first electrode 319, the phase-change material layer 325 and the second electrode 327. The first electrode 319 in the illustrated embodiments is placed in the first opening 317, which is formed in the first insulation layer 315, and on the first insulation layer 315. As also seen in the illustrated embodiments, the diameter of the first opening 317 gradually decreases downward to a smaller diameter and is illustrated as maintaining the smaller diameter substantially uniformly through the layer 311. In other words, an inner sidewall of a top opening 317U of the first opening 317 slopes with a decreasing diameter thereof and an inner sidewall of a bottom opening 317L of the first opening 317 is vertical with a constant diameter thereof.

The first insulation layer 315 may include a sequentially stacked silicon oxynitride layer (SiON) 311 and oxide silicon layer ($SiO_2$) 313. In such embodiments, the top opening 317U of the first opening 317 may be formed in the oxide silicon layer 313 and the bottom opening 317L of the first opening 317 may be formed in the silicon oxynitride layer 311 as shown in FIG. 3B. As illustrated in FIG. 3B, the top opening 317U of the first opening 317 slopes and provides the first electrode 319 a recessed top surface. In other words, the first electrode 319 includes the horizontal part 319H and the recessed slope part 319S. The recessed slope part 319S is placed in the first opening 317 and the horizontal part 319H is placed on the first insulation layer 315 outside of the first opening 317. The top surface 319Hh of the horizontal part 319H of the first electrode 319 is illustrated as flat and the top surface 319Ss of the slope part 319S is sloped. As a result, the top surface 319Ss of the slope part 319S has a "V" shaped configuration.

Referring again to FIG. 3A, a second insulation layer 321 having a second opening 323 is disposed on the first electrode 319. The second opening 323 exposes the recessed slope part 319S of the first electrode 319 (i.e., the top surface 319S of the first electrode 319).

The phase-change material layer 325 is shown as being disposed on the second insulation layer 321 and filling the second opening 323. As a result, the contact area 320 between the phase-change material layer 325 and the first electrode 319 is formed in a sharp, in particular, "V," shape. More specifically, referring to FIG. 3B, the phase-change material layer 325 includes the horizontal part 325H and the vertical part 325V. The horizontal part 325H is placed on the second insulation layer 321. The vertical part 325V extends from the horizontal part 325H and is in contact with the top surface 319Ss of the recessed slope part 319S of the first electrode 319. The tip of the vertical part 325V of the phase-change material layer 325 in the embodiments of FIG. 3B has a conical or "V" shape defined by the recessed slope part 319S of the first electrode 319. In other words, the vertical part 325V of the phase-change material layer 325 includes the vertical sidewall 325Vv and the slope sidewall 325Ss. The vertical sidewall 325Vv is vertical to the horizontal part 325H of the phase-change material layer 325 and the slope sidewall 325Ss defines a sharp tip of the phase-change material layer 325 extending into the lower electrode 319. Thus, FIG. 3B illustrates embodiments of the present invention where a phase-change material layer and a first electrode have a contact area therebetween that extends into a recess (shown as "V" shaped in FIG. 3B) of the first electrode to provide increased current density adjacent thereto as compared to a flat contact area.

As also shown in FIG. 3A, the second electrode 327 is placed on the phase-change material layer 325. A diameter of the second opening 323 in the illustrated embodiments is smaller than that of the bottom opening 317L of the first opening 317. Such a smaller diameter of the second opening 323 may decrease the program current.

The first and second electrodes 319 and 327 may be formed of a single or compound layer selected from the group including a conductive material containing a nitride element, a conductive material containing a carbon element, titanium, tungsten, molybdenum, tantalum, titanium silicide and/or tantalum silicide. For example, the conductive material containing a nitride element could be titan nitride (TiN), tantalum nitride (TaN), molybdenum nitride (MoN), niobium nitride (NbN), silicon titanium nitride (TiSiN), aluminum titan nitride (TiAlN), boron titan nitride (TiBN), silicon zirconium nitride (ZrSiN), silicon tungsten nitride (WsiN), boron tungsten nitride (WBN), aluminum zirconium nitride (ZrAlN), silicon molybdenum nitride (MoSiN), aluminum molybdenum nitride (MoAlN), silicon tantalum nitride (TaSiN), aluminum tantalum nitride (TaAlN), oxy titan nitride (TiON), oxy aluminum titan nitride (TiAlON), oxy tungsten nitride (WON) and/or oxy tantalum nitride (TaON).

The phase-change material layer 325 may be a compound of at least one material having chalcogen elements, such as Te, Se, and/or at least one material selected from the group including or consisting of Ge, Sb, Bi, Pb, Sn, Ag, As, S, Si, P and/or O. In other words, the phase-change material layer 325 may include Ge—Sb—Te, As—Sb—Te, As—Ge—Sb—Te, Sn—Sb—Te, 5A group-Sb—Te, 6A group-Sb—Te, 5A group-Sb—Se and/or 6A group-Sb—Se.

As the contact area 320 between the phase-change material layer 325 and the first electrode 319 has a sharp profile, shown as "V" shaped in FIG. 3B, a current pulse supplied through the first electrode 319 generally flows in the direction indicated by the arrows is FIG. 3B. Accordingly, current density may be concentrated in the conical or "V" shaped tip of the phase-change material layer 325. As a result, the program current may be reduced. As shown in the embodiments of FIG. 3B, the program volume 300 may have a generally conical shape.

Figure 4:
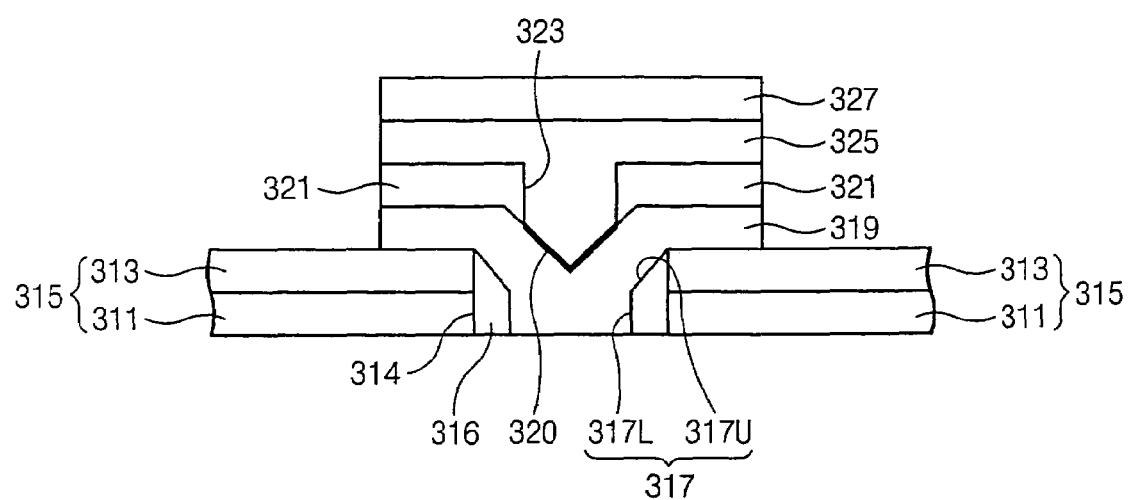
FIG. 4 is a schematic cross-sectional view of a phase-change memory device according to further embodiments of the present invention.

FIG. 4 is a schematic cross-sectional view of a phase-change memory device according to further embodiments of the present invention. FIG. 4 is generally the same as FIG. 3A except for the first insulation layer structure as will be described herein. In the embodiments of FIG. 4, the device includes a sidewall spacer 316 of the insulation layer 315 and a temporary opening 314. More particularly, as shown in FIG. 4, the first insulation layer 315 has a temporary opening 314 having a substantially constant diameter. The sidewall spacer 316 of the insulation layer 315 is placed on both sidewalls of the temporary opening 314 to define the first opening 317. As also shown in FIG. 4, the top of the sidewall spacer 316 of the insulation layer 315 is sloped. As a result, as shown in FIG. 4, an inner sidewall of a top opening 317U (corresponding to the top of the sidewall spacer) of the first opening 317 slopes with a decreasing diameter thereof, and an inner sidewall of a bottom opening 317L (corresponding to the bottom of the sidewall spacer) of the first opening 317 is vertically shaped with a constant diameter thereof.

A method for forming a phase-change memory device according to some embodiments of the present invention will now be described with reference to FIGS. 5 through 14. FIGS. 5 through 14 are schematic cross-sectional views illustrating sequential processing operations for manufacturing the phase-change memory device shown in FIG. 3A and FIG. 3B.

Figure 5:
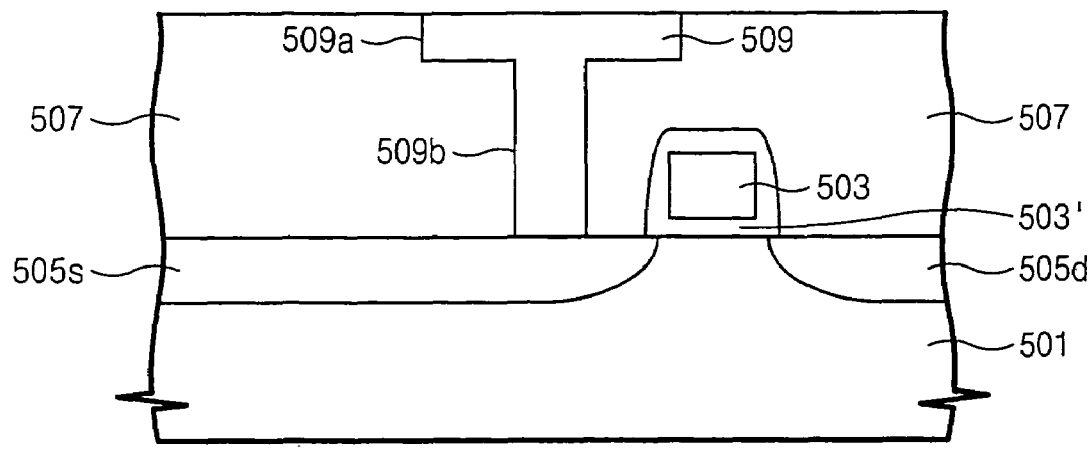
FIGS. 5 through 14 are schematic cross-sectional views illustrating processing operations for manufacturing the phase-change memory device shown in FIG. 3A according to some embodiments of the present invention.

Referring now to to FIG. 5, a transistor including a gate electrode 503, a source region 505s and a drain region 505d is formed, for example, by a conventional metal on semiconductor field effect transistor (MOSFET) technique on an integrated circuit (semiconductor) substrate 501. The gate electrode 503 shown in FIG. 5 is formed on the semiconductor substrate 501 and extends in a direction into and out of the figure. The source and drain regions 505s and 505d are formed on the substrate 501 on the sides of the gate electrode 503, that is, in an active region. A gate insulation layer 503' is disposed between the gate electrode 503 and the substrate 501.

A lower interlayer dielectric layer 507 may be continuously formed to completely cover the transistor. The lower interlayer dielectric layer 507 may be formed of a silicon oxide layer, for example, by chemical vapor deposition (CVD).

The lower interconnection process and contact pad process may then be carried out. The lower interconnection (not shown) is a conductive interconnection that is electrically connected to the drain region 505d of the transistor. In other words, the lower interconnection can extend to be parallel to the gate electrode 503. A contact pad 509 is electrically connected to the source region 505s of the transistor. For the illustrated embodiments, the lower interconnection and the contact pad 509 are formed by a dual damascene process. More specifically, the lower interlayer dielectric layer 507 is patterned to form a pad opening 509a and contact hole 509b. The contact hole 509b exposes the source region 505s. A trench for a lower interconnection and a contact hole exposing the drain region 505d may be formed when patterning the lower interlayer dielectric layer 507. The opening for the contact pad 509a, the contact hole 509b and the trench for the lower interconnection may be filled with a conductive material, such as tungsten. The contact pad 509 and the lower interconnection may then be completed by, for example, a planarization process.

The lower interconnection and the contact pad 509 may be formed by other methods than that described above. For example, the lower interlayer dielectric layer 507 may be patterned to form contact holes exposing the source region 505s and the drain region 505d. The conductive material may then be formed on the lower interlayer dielectric layer 507 to fill the contact holes and patterned to form the lower interconnection and the contact pad 509.

Figure 6:
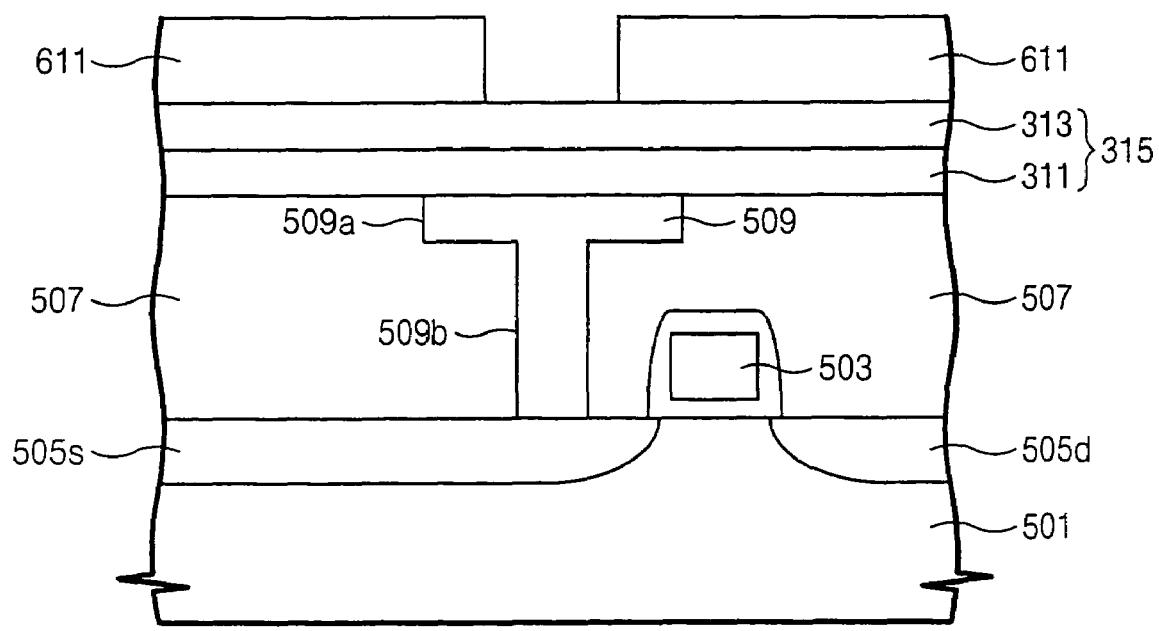

As shown in FIG. 6, a first insulation layer 315 is formed on the contact pad 509, the lower interconnection and the lower interlayer dielectric layer 507. A silicon oxynitride layer (SiON) 311 and a silicon oixde layer (SiO$_2$) 313 may be sequentially stacked to form the first insulation layer 315. A first etching mask 611 may be continuously formed on the first insulation layer 315. The first etching mask 611 may be formed, for example, by spin coating a photoresist layer and then exposing and developing.

Figure 7:
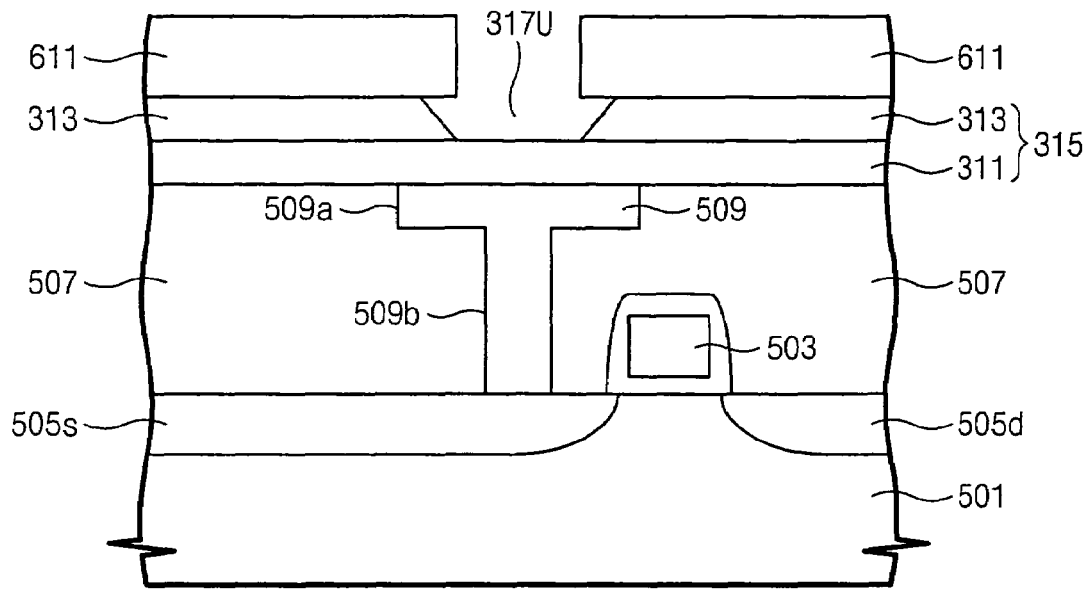

Referring to FIG. 7, a partial thickness of the first insulation layer 315 exposed by the first etching mask 611 is removed to form a top opening 317U such that the diameter of the top opening 317U gradually decreases. When the first insulation layer 315 is double-layered structure of the silicon oxynitride layer 311 and the silicon oxide layer 313, the silicon oxide layer 313 may be removed using the silicon oxynitride layer as an etching stopper as shown in FIG. 7. In other words, the top opening 317U may be formed in the silicon oxide layer 313. The first insulation layer 315 (or the oxide silicon layer) may be removed using, for example, isotropic etching using a wet etchant.

Figure 8:
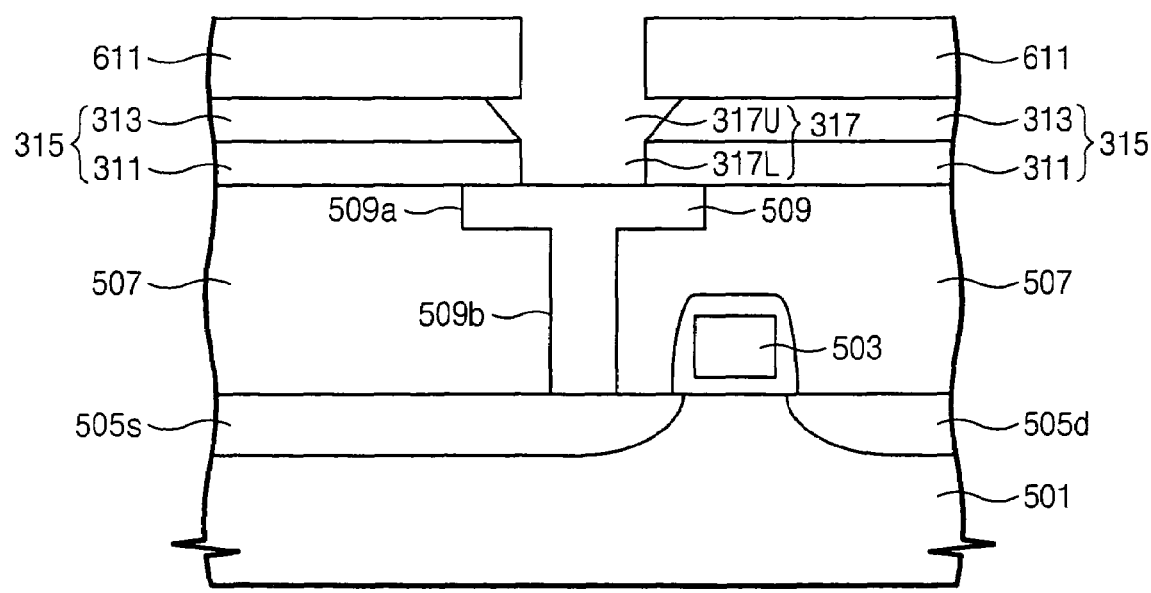

As shown in FIG. 8, the first insulation layer 315 (or the silicon oxynitride layer 311) exposed by the top opening 317U is etched using the first etching mask 611 to form a bottom opening 317L exposing the contact pad 509. The top opening 317U and the bottom opening 317L together constitute a first opening 317. The first insulation layer 315 (or the nitride oxide layer 311) may be formed using a dry etching process.

Figure 9:
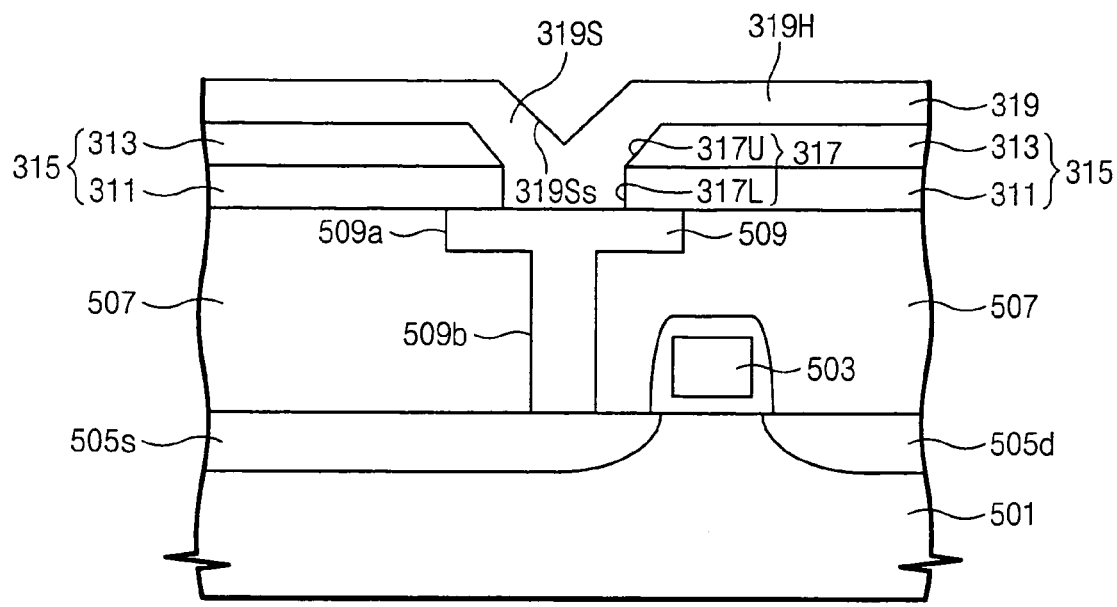

Referring to FIG. 9, after removing the first etching mask 611, a first electrode layer 319 is formed in the first opening 317 and on the first insulation layer 315. As a diameter of the top of the first opening 317, that is, the top opening 317U, becomes gradually decreased, the first electrode layer 319 has a recessed slope part 319S in the first opening 317. The recessed slope part 319S has a concave, more particularly, "V" shape. In other words, the configuration of the top surface 319Ss of the recessed slope part 319S has a concave shape. The first electrode 319 may be formed of a conductive material containing a nitride element, a conductive material containing a carbon element, titanium, tungsten, molybdenum, tantalum, titanium silicide, tantalum silicide and/or a combination thereof. The first electrode 319 may be formed by deposition methods, such as chemical vapor deposition (CVD), plasma vapor deposition (PVD) and/or atomic layer deposition (ALD). The conductive material containing a nitride element may be one or more of titan nitride (TiN), tantalum nitride (TaN), molybdenum nitride (MoN), niobium nitride (NbN), silicon titanium nitride (TiSiN), aluminum titan nitride (TiAlN), boron titan nitride (TiBN), silicon zirconium nitride (ZrSiN), silicon tungsten nitride (WsiN), boron tungsten nitride (WBN), aluminum zirconium nitride (ZrAlN), silicon molybdenum nitride (MoSiN), aluminum molybdenum nitride (MoAlN), silicon tantalum nitride (TaSiN), aluminum tantalum nitride (TaAlN), oxy titan nitride (TiON), oxy aluminum titan nitride (TiAlON), oxy tungsten nitride (WON) and/or oxy tantalum nitride (TaON).

Figure 10:
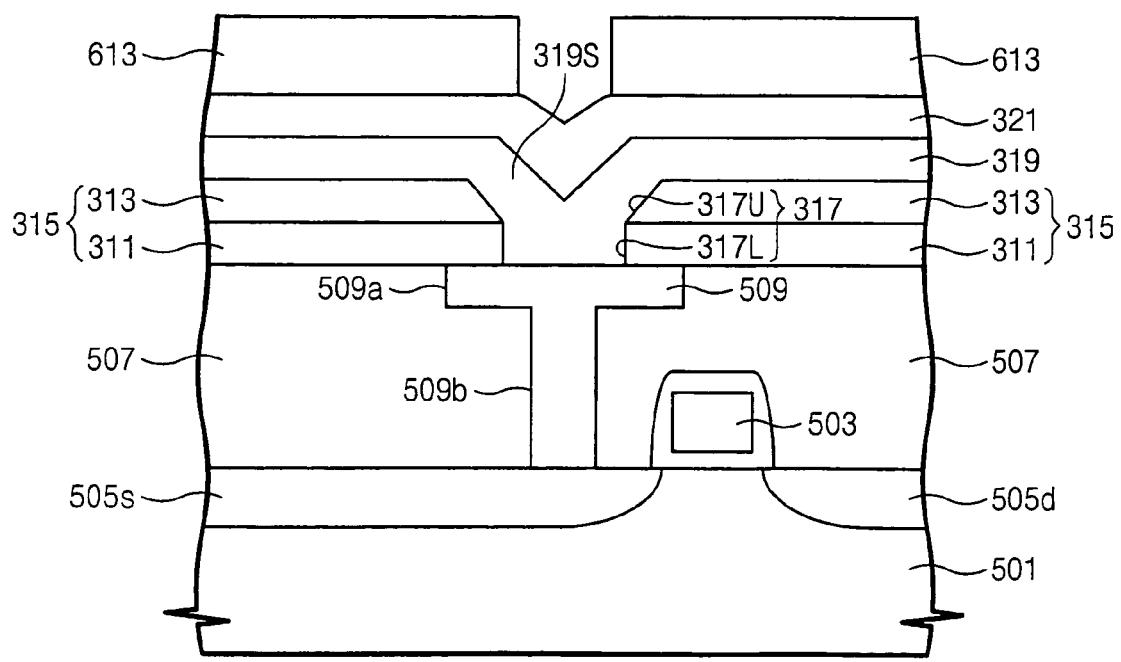

As shown in FIG. 10, a second insulation layer 321 may be formed on the first electrode layer 319. The second insulation layer can be formed of oxide silicon using CVD. A second etching mask 613 may be continuously formed on the second insulation layer 321.

Figure 11:
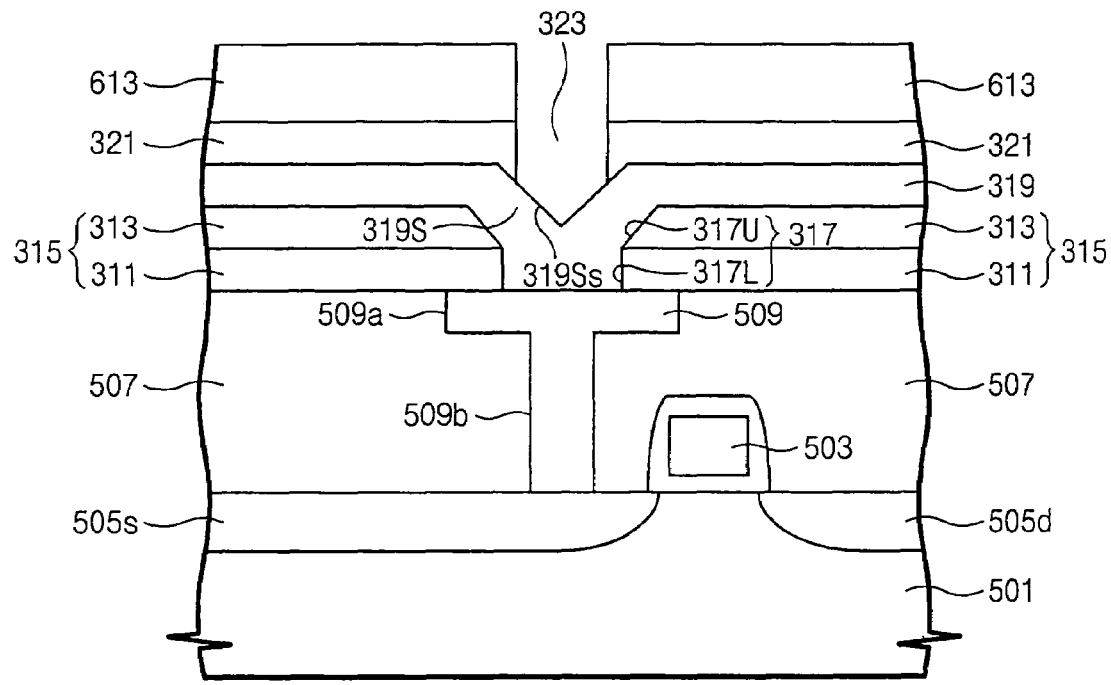

Referring to FIG. 11, the second insulation layer 321 that is exposed by the second etching mask 613 may be anisotropically etched to form a second opening 323 exposing the top surface 319Ss of the recessed slope part 319S of the first electrode 319. A diameter of the second opening 323 in some embodiments is smaller than a diameter of the bottom opening 317L of the first opening 317. The second opening 323 may be formed as small as practically possible for a photolithographic process technology used in forming the second opening 323.

Figure 12:
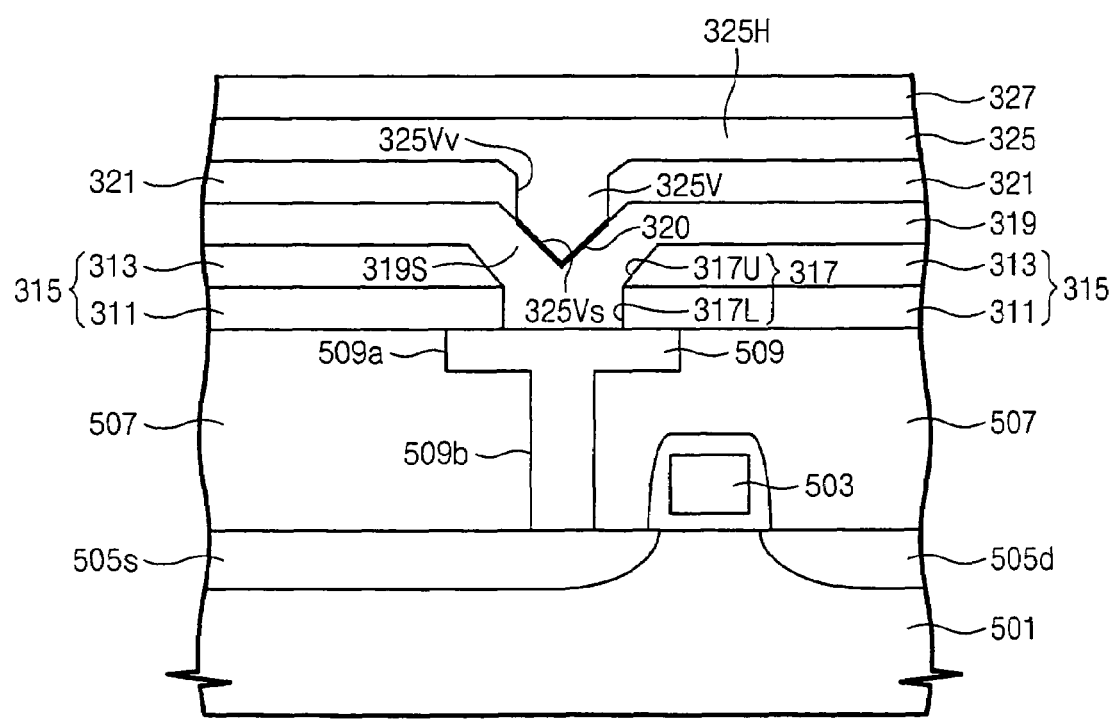

Referring now to FIG. 12, after removing the second etching mask 613, a phase-change material layer 325 and a second electrode layer 327 may be sequentially formed. The phase-change material layer 325 may be formed on the second insulating layer 321 and filling the second opening 323. Thus, the phase-change material layer 323 includes a vertical part 325V and a horizontal part 325H. The vertical part 325V fills the second opening 323 and the horizontal part 325H is on the second insulation layer 321. As shown in FIG. 12, the contact area 320 between the first electrode 319 and the phase-change material layer 325 has a concave, more particularly, "V" or "cone" shaped profile.

The phase-change material layer 325 may be a compound of at least one material having chalcogen elements, such as Te and/or Se, and at least one material selected from the group including Ge, Sb, Bi, Pb, Sn, Ag, As, S, Si, P and/or O. In other words, the phase-change material layer 325 may include Ge—Sb—Te, As—Sb—Te, As—Ge—Sb—Te, Sn—Sb—Te, 5A group-Sb—Te, 6A group-Sb—Te, 5A group-Sb—Se and/or 6A group-Sb—Se.

The second electrode 327 may be formed of a material selected from the group including a conductive material containing a nitride element, a conductive material containing a carbon element, titanium, tungsten, molybdenum, tantalum, titanium silicide, tantalum suicide and/or a combination thereof. The second electrode 327 may also be formed of a multi-layered structure including the titanium layer and the nitride titanium layer, which layers may be stacked sequentially.

Figure 13:
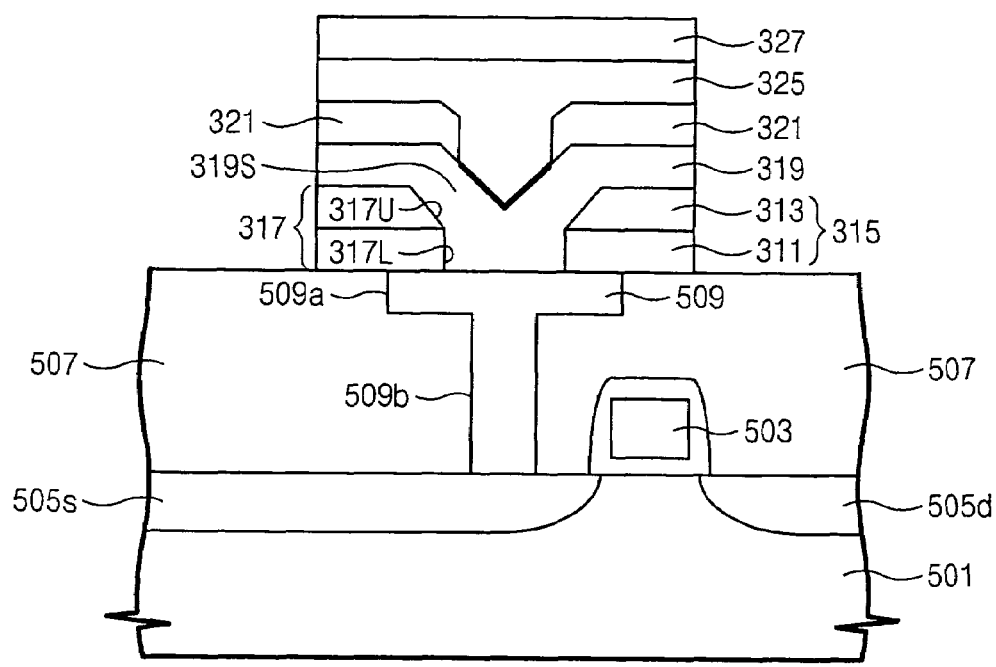

As shown in FIG. 13, the second electrode layer 327, the phase-change material layer 325, the second insulation layer 321 and the first electrode layer 319 may be sequentially patterned to form a phase-change memory cell separated from a neighboring cell. A silicon oxynitride layer and a silicon oxide layer may be selectively sequentially formed on the second electrode layer 327.

Figure 14:
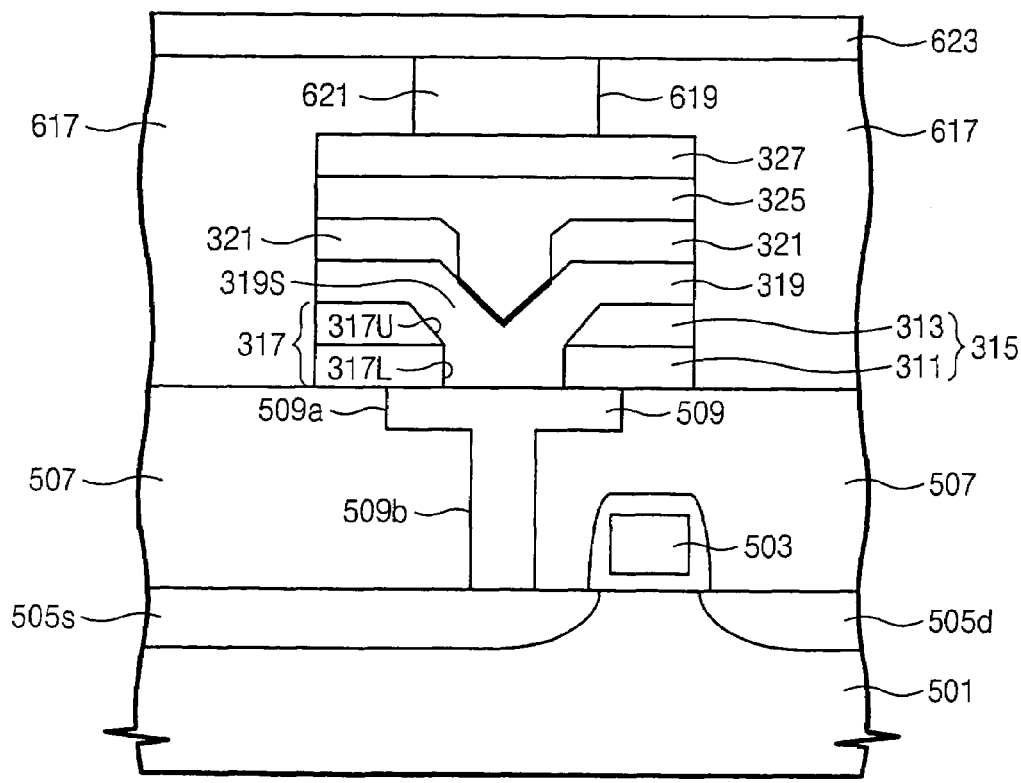

Operations related to embodiments of forming an upper interconnection process will now be described with reference to FIG. 14. After patterning the second electrode layer 327, the phase-change material layer 325, the second insulation layer 321 and the first electrode layer 319, an upper interlayer dielectric layer 617 may be formed as shown in FIG. 14. The upper interlayer dielectric layer 617 may be continuously patterned to form a via hole 619 exposing the patterned second electrode layer 327, which forms the second electrode. A conductive material may be formed to fill the via hole 619 on the upper interlayer dielectric layer 617. The conductive material may be planarized to form the second electrode contact 621. The second electrode contact 621 may be formed, for example, of tungsten. An interconnection material may then be deposited on the second electrode contact 621 and on the upper interlayer dielectric layer 617. The interconnection material may be patterned to form an upper interconnection 623. For example, the upper interconnection 623 can be formed of aluminum, aluminum copper alloy, aluminum copper silicon alloy, tungsten silicide, titanium, tungsten, molybdenum, tantalum, tungsten titanium and/or copper.

While not shown in FIG. 14, a protection insulation layer can be further formed to protect the phase-change memory cell before forming the upper interlayer dielectric layer 617. For example, the protection insulation layer can be formed of silicon oxide $SiO_2$, silicon nitride $SiO_x$, silicon oxynitride SiON, oxide aluminum $ALO_x$ and/or titanium oxide $TiO_2$.

Figure 15:
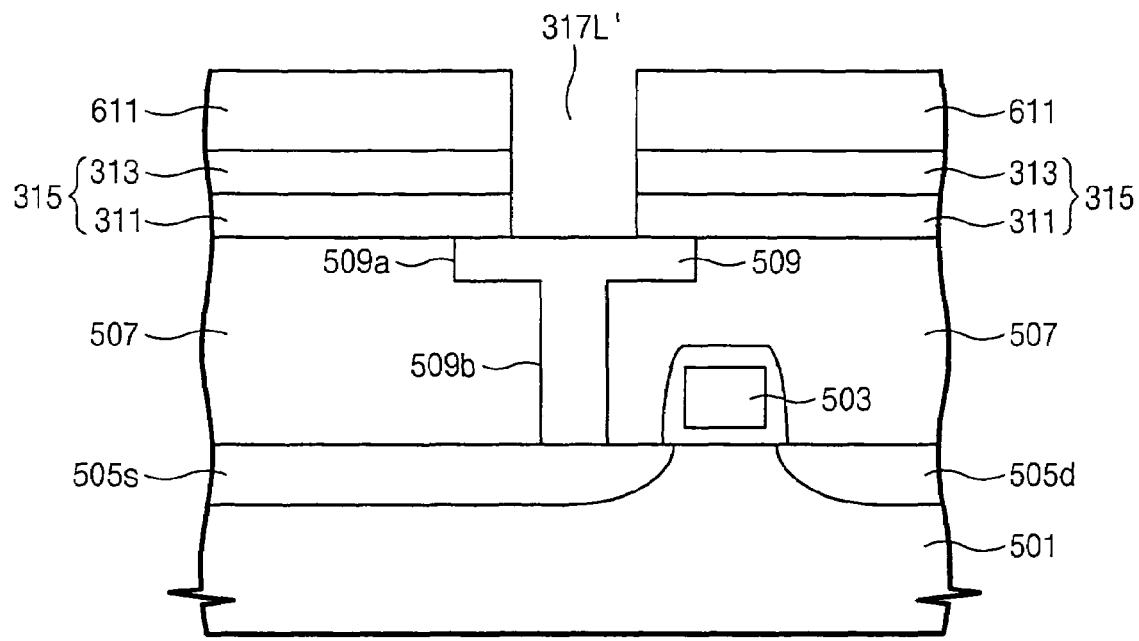
FIGS. 15 and 16 are schematic cross-sectional views illustrating processing operations for manufacturing the phase-change memory device shown in FIG. 3A according to other embodiments of the present invention.
Figure 16:
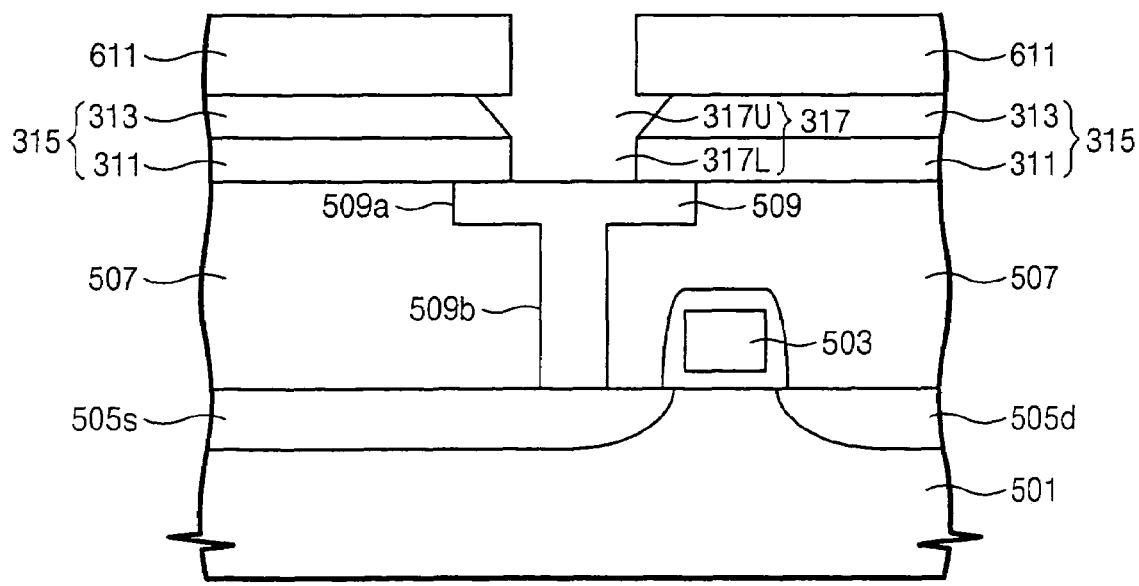

In some embodiments of the present invention, the first opening 317 (FIG. 8) is formed by sequentially performing isotropic etching and anisotropic etching. However, this etching order can be reversed in other embodiments. That is, as shown in FIG. 15, the first insulation layer 315 exposed by the first etching mask 611 may be anisotropically etched to form a temporary bottom opening 317L'. As shown in FIG. 16, after forming the temporary bottom opening 317L', an isotropic etching process may be performed to slope the top of the temporary bottom opening 317L'. As a result, the first opening 317 composed of the top opening 317U and the bottom opening 317L' is formed. A diameter of the top opening 317U gradually decreases and the bottom opening 317L corresponds to the bottom of the temporary bottom opening 317L'.

Methods for forming the phase-change memory device shown in FIG. 4 according to some embodiments of the present invention will now be described with reference to FIGS. 17 through 20. Redundant aspects related to like numbered elements and corresponding functions to the previously described embodiments will not be repeated in connection with this description except as necessary to further understanding of the embodiments of FIGS. 17 through 20.

Figure 17:
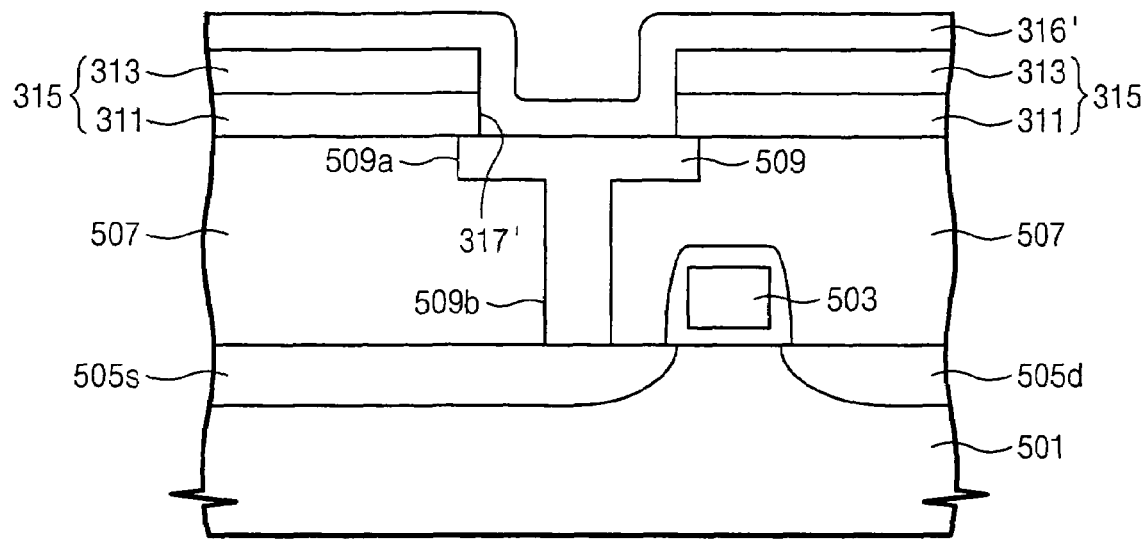
FIGS. 17 through 20 are schematic cross-sectional views illustrating processing operations for manufacturing the phase-change memory device shown in FIG. 4 according to some embodiments of the present invention.

Referring first to FIG. 17, after forming a transistor, a lower interlayer dielectric layer 507, a contact pad 509, a lower interconnection (not shown) and a first insulation layer 315 are formed generally as described above. The first insulation layer 315 may be continuously patterned to form a temporary first opening 317' exposing the contact pad 509. A spacer insulation layer 316' may then be formed on the temporary first opening 317' and the first insulation layer 315.

Figure 18:
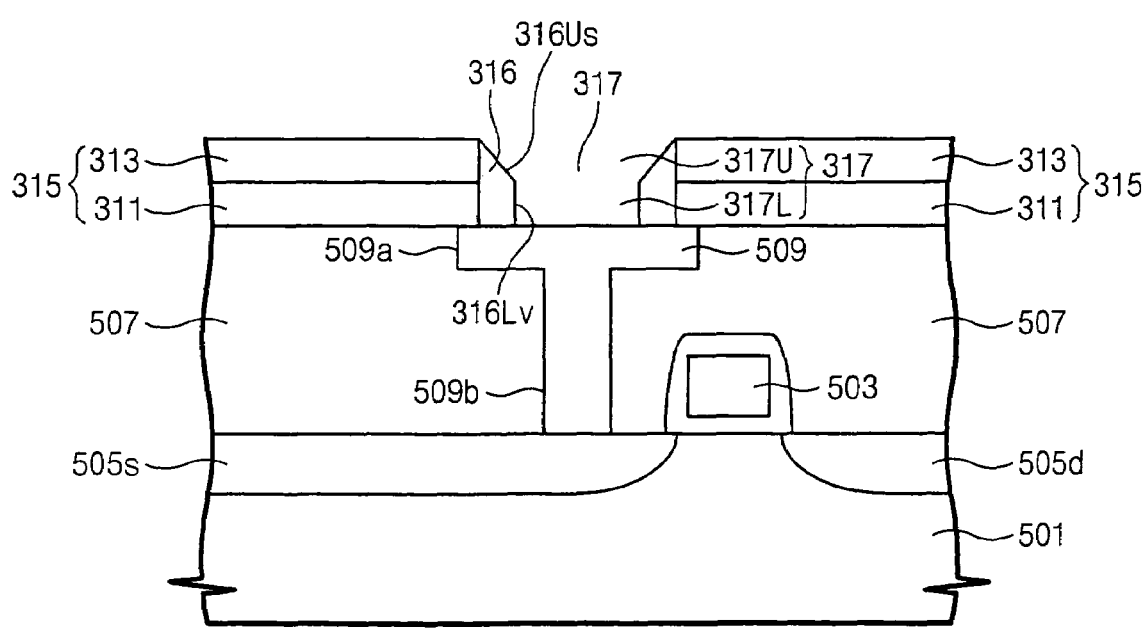

As shown in the embodiments of FIG. 18, the spacer insulation layer 316' is anisotropically etched to form a lateral spacer 316 on both sidewalls of the temporary first opening 317' to define the first opening 317. A top of the lateral spacer 316Us shown in FIG. 18 is sloped and a bottom part of the lateral spacer 316Lv is vertical. Thus, the first opening 317 is divided into the top opening 317U and the bottom opening 317L. The diameter of the top opening 317U gradually decreases due to the slope of the top of the lateral spacer 316Us. The diameter of the bottom opening 317L is substantially constant due to the vertical structure of the bottom part of the lateral spacer 316Lv.

Figure 19:
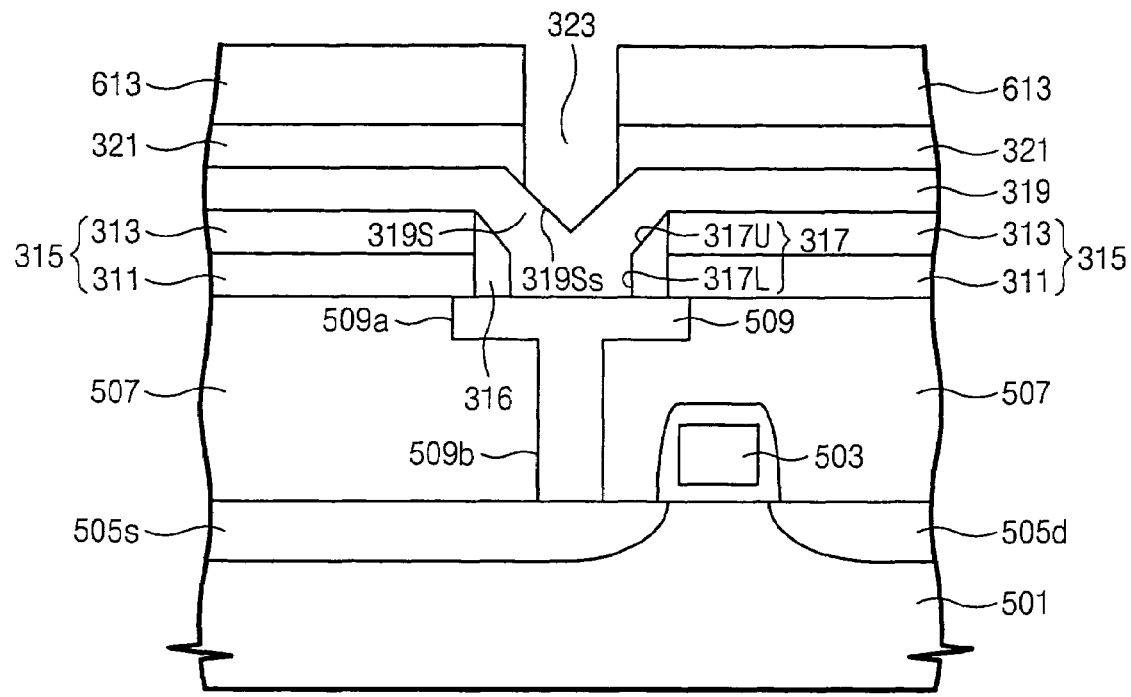

Referring to FIG. 19, a first electrode layer 319 and a second electrode layer 321 may be sequentially formed on the first opening 317 and the first insulation layer 315. As previously described, the first electrode 319 may have a recessed slope part 319S. The configuration of the top surface 319Ss of the recessed slope part 319S may be concave, more particularly, "V" shaped. After forming the second etching mask 613 on the second insulation layer 321, the second exposed insulation layer 321 may be anisotropic etched to form a second opening 323 exposing the recessed slope part 319S of the first electrode 319.

Figure 20:
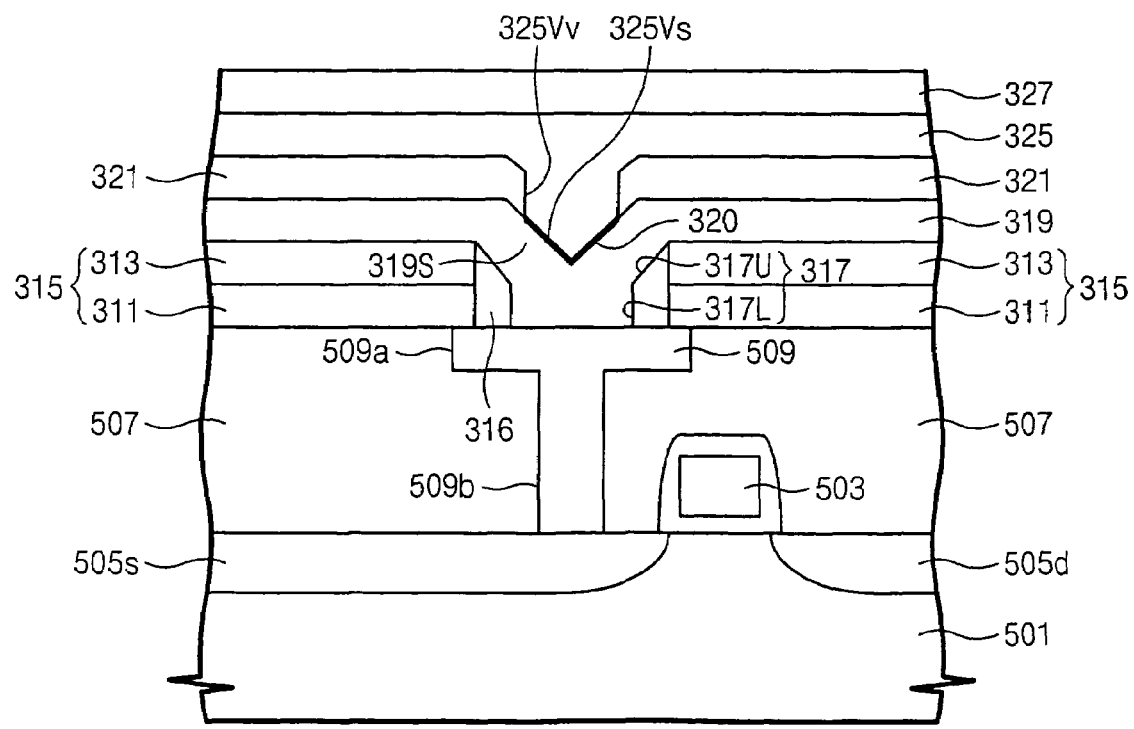

As shown in FIG. 20, after removing the second etching mask 613, the phase-change material layer 325 and the second electrode layer 327 may be sequentially formed. The second electrode layer 327, the phase-change material layer 325, the second insulation layer 321 and the first electrode layer 319 may then be serially patterned to form the phase-change memory cell separated from a neighboring cell. A top interconnection process may be subsequently performed.

As previously discussed, as the contact area of the first electrode and the phase-change material layer is formed with a concave, sharp or "V" shaped configuration, a current density can be integrated, which may reduce current required during programming.

While the present invention has been described in connection with specific and illustrative embodiments thereof, it is capable of changes and modifications without departing from the spirit and scope of the invention. It should be appreciated that the scope of the invention is not limited to the detailed description of the invention hereinabove, which is intended merely to be illustrative, but rather comprehends the subject matter defined by the following claims.

What is claimed is:

1. A method for fabricating a phase-change memory device comprising:
   forming a first insulation layer having a first opening therein on an integrated circuit substrate;
   forming a first electrode on the first insulation layer, the first electrode including a recess in an upper portion thereof in the first opening; and
   forming a phase-change material layer on the first electrode and extending into the recess, wherein the recess tapers away from the phase-change material layer.

2. A method for fabricating a phase-change memory device comprising:
   forming a first insulation layer having a first opening therein on an integrated circuit substrate;
   forming a first electrode on the first insulation layer, the first electrode having a vertical part including a recess in an upper portion thereof in the first opening; and
   forming a phase-change material layer on the first electrode and extending into the recess, wherein:
   forming a first insulation layer includes patterning the first insulation layer to form the first opening, the first opening including a top opening defined by a sloped upper sidewall part and a bottom opening defined by a substantially vertical bottom sidewall part;
   forming a first electrode includes forming a conformal first electrode layer along the first insulation layer and the first opening to have a recessed slope part in the first opening;
   forming a phase-change material layer comprises:
   forming a second insulation layer on the first electrode layer;
   patterning the second insulation layer to have a second opening exposing the recessed slope part of the first electrode layer; and
   forming a phase-change material layer on the second insulation layer to fill the second opening, the method further comprising:
   forming a second electrode layer on the phase-change material layer; and
   sequentially patterning the second electrode layer, the phase-change material layer, the second insulation layer and the first electrode layer.

3. The method for fabricating the phase-change memory device of claim 2, wherein patterning the first insulation layer comprises:
   forming an etching mask on the first insulation layer;
   isotropic etching a partial thickness of the first insulation layer exposed by the etching mask to form the top opening; and then
   anisotropic etching a remainder of the first insulation layer exposed by the etching mask to form a bottom opening.

4. The method for fabricating the phase-change memory device of claim 2, wherein patterning the first insulation layer comprises:
   forming an etching mask on the first insulating layer;
   anisotropic etching the first insulation layer exposed by the etching mask to form a temporary bottom opening having diameter of the bottom opening on the first insulation layer; and then
   isotropic etching a partial thickness of the first insulation layer defining the top of the temporary bottom opening to form the top opening, wherein a residual temporary bottom opening corresponds to the bottom opening.

5. The method for fabricating the phase-change memory device of claim 3, wherein the first insulation layer is formed by sequentially stacking a silicon oxynitride layer and a silicon oxide layer, and wherein the top opening is formed in the oxide silicon layer, and wherein the bottom opening is formed in the silicon oxynitride layer.

6. The method for fabricating the phase-change memory device of claim 4, wherein the first insulation layer is formed by sequentially stacking a silicon oxynitride layer and a silicon oxide layer and wherein the top opening is formed in the oxide silicon layer, and wherein the bottom opening is formed in the silicon oxynitride layer.

7. The method for fabricating the phase-change memory device of claim 2, wherein the second opening is formed to have a diameter smaller than a diameter of the bottom opening of the first opening.

8. The method for fabricating the phase-change memory device of claim 2, further comprising:
   forming a silicon oxynitride layer and a silicon oxide layer on the second electrode layer, after forming the second electrode layer; and
   patterning the silicon oxide layer and the silicon oxynitride layer while patterning the second electrode layer, the phase-change material layer, the second insulation layer and the first electrode layer.

9. The method for fabricating the phase-change memory device of claim 8, further comprising:

before forming the first insulation layer:
forming a transistor on the semiconductor substrate;
forming a first interlayer dielectric layer to cover the transistor on the semiconductor substrate; and
forming a contact pad electrically connected to a source region of the transistor and a first interconnection connected to a drain region of the transistor, and after patterning the oxide layer, the nitride oxide layer, the second electrode layer, the phase-change material layer, the second insulation layer and the first electrode layer:
forming a protection insulation layer;
forming a second interlayer dielectric layer on the protection insulation layer;
patterning the second interlayer dielectric layer, the protection insulation layer, the patterned silicon oxide layer and the patterned silicon oxynitride layer to form a via hole exposing the patterned second electrode layer;
filling the via hole with a conductive material; and
forming a second interconnection on the second interlayer dielectric layer and the conductive material.

10. A method for fabricating a phase-change memory device, comprising:

forming a first insulation layer on a semiconductor substrate;
patterning the first insulation layer to form a temporary opening;
forming an insulation layer spacer on a sidewall of the temporary opening, the insulation layer spacer defining a first opening comprised of a top opening defined by a sloped-top lateral part and a bottom opening defined by a vertical-bottom-lateral part;
forming a first electrode layer along the first opening and the first insulation layer to have a recessed slope part in the first opening;
forming a second insulation layer on the first electrode layer;
patterning the second insulation layer to have a second opening exposing the recessed slope part of the first electrode layer;
forming a phase-change material layer in the second opening and on the second insulation layer;
forming a second electrode layer on the phase-change material layer; and
sequentially patterning the second electrode layer, the phase-change material layer, the second insulation layer and the first electrode layer.

11. The method for fabricating the phase-change memory device of claim 10, wherein the second opening is formed to have a diameter smaller than a diameter of the bottom opening of the first opening.

12. The method for fabricating the phase-change memory device of claim 10, further comprising:

forming a silicon oxynitride layer and an silicon oxide layer on the second electrode layer after forming the second electrode layer; and
patterning the silicon oxide layer and silicon oxynitride layer while sequentially patterning the second electrode layer, the phase-change material layer, the second insulation layer and the first electrode layer.

13. The method for fabricating the phase-change memory device of claim 12, further comprising:

before forming the first insulation layer:
forming a transistor on the semiconductor substrate;
forming a first interlayer dielectric layer to cover the transistor on the semiconductor substrate; and
forming a contact pad electrically connected to a source region of the transistor and a first interconnection connected to a drain region of the transistor, and
after sequentially patterning the silicon oxide layer, the silicon oxynitride layer, the second electrode layer, the phase-change material layer, the second insulation layer and the first electrode layer:
forming a protection insulation layer;
forming a second interlayer dielectric layer on the protection insulation layer;
patterning the second interlayer dielectric layer, the protection insulation layer, the patterned oxide silicon layer and the silicon oxynitride layer to form a via hole exposing the patterned second electrode layer;
filling the via hole with a conductive material; and
forming a second interconnection on the second interlayer dielectric layer and the conductive material.

* * * * *